(12) United States Patent
Pan et al.

(10) Patent No.: US 12,316,730 B2
(45) Date of Patent: May 27, 2025

(54) CLOCK DATA RECOVERY CIRCUIT AND CLOCK DATA RECOVERY METHOD

(71) Applicants: SANECHIPS TECHNOLOGY CO., LTD., Guangdong (CN); SOUTHERN UNIVERSITY OF SCIENCE AND TECHNOLOGY, Guangdong (CN)

(72) Inventors: Quan Pan, Guangdong (CN); Wenbo Xiao, Guangdong (CN); Qiwei Huang, Guangdong (CN); Junyi Yang, Guangdong (CN); Xuewei Ding, Guangdong (CN); Yingli Hao, Guangdong (CN)

(73) Assignees: SANECHIPS TECHNOLOGY CO., LTD., Guangdong (CN); SOUTHERN UNIVERSITY OF SCIENCE AND TECHNOLOGY, Guangdong (CN)

( * ) Notice: Subject to any disclaimer, the term of this patent is extended or adjusted under 35 U.S.C. 154(b) by 138 days.

(21) Appl. No.: 18/279,895

(22) PCT Filed: Nov. 15, 2021

(86) PCT No.: PCT/CN2021/130752
§ 371 (c)(1),
(2) Date: Sep. 1, 2023

(87) PCT Pub. No.: WO2022/183774
PCT Pub. Date: Sep. 9, 2022

(65) Prior Publication Data
US 2024/0146502 A1    May 2, 2024

(30) Foreign Application Priority Data

Mar. 1, 2021    (CN) .......................... 202110224295.0

(51) Int. Cl.
H04L 7/033     (2006.01)
H03L 7/08      (2006.01)
H04L 7/00      (2006.01)

(52) U.S. Cl.
CPC .......... H04L 7/0331 (2013.01); H03L 7/0807 (2013.01); H04L 7/0087 (2013.01)

(58) Field of Classification Search
CPC ..... H04L 7/0331; H04L 7/0087; H04L 7/033; H03L 7/07; H03L 7/0814; H03L 7/093; H03L 7/18; H04J 3/047; H04J 3/0685
See application file for complete search history.

(56) References Cited

U.S. PATENT DOCUMENTS 5,036,298 A    7/1991   Bulzachelli
6,249,160 B1   6/2001   Tagami
(Continued)

FOREIGN PATENT DOCUMENTS

JP    2003051743 A    2/2003
JP    2012205204 A    10/2012
(Continued)

OTHER PUBLICATIONS

Japan Patent Office, First Office Action issued Jul. 9, 2024 for application No. JP2023-553438.
(Continued)

*Primary Examiner* — Sung S Ahn
(74) *Attorney, Agent, or Firm* — Li & Cai Intellectual Property (USA) Office

(57) ABSTRACT

A clock data recovery circuit and a clock data recovery method are provided. The clock data recovery circuit includes a time delay loop (100), a frequency locking loop (200) and a deserializer (300). The time delay loop (100) is configured to delay input data according to a phase of a clock signal to realize phase alignment; the frequency lock-
(Continued)

ing loop (200) is connected to the time delay loop (100), and is configured to adjust a frequency of the clock signal according to the delayed input data to make the frequency of the clock signal be consistent with a frequency of the input data; and the deserializer (300) is respectively connected to the time delay loop (100) and the frequency locking loop (200), and is configured to deserialize the input data according to the clock signal.

10 Claims, 6 Drawing Sheets

(56) References Cited

U.S. PATENT DOCUMENTS

| | | | |
|---|---|---|---|
| 9,559,836 B1* | 1/2017 | Hata | ............... H04L 7/0337 |
| 2011/0075781 A1 | 3/2011 | Kenney | |
| 2015/0200768 A1 | 7/2015 | Shibasaki | |
| 2017/0063384 A1 | 3/2017 | Chi | |
| 2021/0184829 A1* | 6/2021 | Duan | ............ G06F 13/4278 |

FOREIGN PATENT DOCUMENTS

| | | |
|---|---|---|
| JP | 2015133620 A | 7/2015 |
| JP | 2016171387 A | 9/2016 |
| WO | 2004098120 A1 | 11/2004 |
| WO | 2008114509 A1 | 9/2008 |

OTHER PUBLICATIONS

European Patent Office, The extended European search report issued Jul. 30, 2024 for application No. EP21928846.1.

* cited by examiner

CLOCK DATA RECOVERY CIRCUIT AND CLOCK DATA RECOVERY METHOD

CROSS-REFERENCE TO RELATED APPLICATIONS

The present application is based on and claims a priority of the Chinese patent application No. 202110224295.0 filed on Mar. 1, 2021, the entire disclosure of which is incorporated herein by reference.

TECHNICAL FIELD

The present application relates to the field of communications, and particularly relates to a clock data recovery circuit and a clock data recovery method.

BACKGROUND

In some technical solutions, a phase locking loop in the clock data recovery circuit realizes frequency and phase locking by negative feedback between a phase discriminator, a charge pump, a loop filter, and a voltage controlled oscillator. It has been found in small signal model analysis that a small signal equation $K_{VCO}/s$ of the voltage controlled oscillator is an integral unit, phase accumulations are performed constantly during the process of phase locking, the filter has a capacitance of $1/sC$, and charges are accumulated during the charging and discharging processes. Therefore, there are two poles in the closed-loop simulation. In a system with two poles, a phase margin, a gain margin or other stability-related factors of the system must be considered in design of the circuit. Therefore, in some technical solutions, a high-order filter for compensation is necessary in the phase locking loop to ensure stability of the system. Meanwhile, in some technical solutions, the clock data recovery circuit further includes a frequency locking loop for realizing frequency locking. The frequency locking loop and the phase locking loop must work cooperatively, resulting in a complex circuit structure of the clock data recovery circuit.

SUMMARY

Embodiments of the present application provide a clock data recovery circuit and a clock data recovery method.

In a first aspect, an embodiment of the present application provides a clock data recovery circuit, including a time delay loop, a frequency locking loop and a deserializer, wherein the time delay loop is configured to delay input data according to a phase of a clock signal to realize phase alignment; the frequency locking loop is connected to the time delay loop, and is configured to adjust a frequency of the clock signal according to the delayed input data to make the frequency of the clock signal be consistent with a frequency of the input data; and the deserializer is respectively connected to the time delay loop and the frequency locking loop, and is configured to deserialize the input data according to the clock signal.

In a second aspect, an embodiment of the present application provides a clock data recovery method applied to a clock data recovery circuit, the clock data recovery circuit including a time delay loop, a frequency locking loop and a deserializer, wherein the time delay loop is connected to the frequency locking loop, and the deserializer is respectively connected to the time delay loop and the frequency locking loop, and the method includes: delaying, by the time delay loop, input data according to a phase of a clock signal to realize phase alignment; adjusting, by the frequency locking loop, a frequency of the clock signal according to the delayed input data to make the frequency of the clock signal be consistent with a frequency of the input data; and deserializing, by the deserializer, the input data according to the clock signal.

Other features and advantages of the present application will be set forth in the description which follows, and will become apparent from the description at least partially, or be understood by implementing the present application. Objects and other advantages of the present application may be realized and obtained by means of the structures specified in the description, appended claims and drawings.

BRIEF DESCRIPTION OF DRAWINGS

Accompanying drawings are provided for further understanding of the technical solution of the present application and constitute a part of the specification. Hereinafter, these drawings are intended to explain the technical solution of the present application together with the following embodiments, but should not be considered as a limitation to the technical solution of the present application.

The present application is further described below with reference to the accompanying drawings and embodiments.

DETAIL DESCRIPTION OF EMBODIMENTS

Specific embodiments of the present application will be described in detail below, where some embodiments of the present application are illustrated in the accompanying drawings which are intended to graphically supplement the description in the text of the specification, so that a person can visually and vividly understand each and every technical feature and the whole technical solution of the present application, but the drawings should not be interpreted as limiting the scope of the present application.

In the description of the present application, should there be any reference to "first" and "second", it is merely intended to distinguish technical features, instead of being interpreted as indicating or implying any relative importance or implying any number of the indicated technical features or implying any precedence of the indicated technical features.

In the description of the present application, unless otherwise explicitly defined, terms such as "configure", "install", "connect" and the like should be understood broadly, and those skilled in the art can reasonably determine the specific meanings of the above terms in the present application in combination with specific contents of the technical solutions.

Embodiments of the present application provide a clock data recovery circuit and a clock data recovery method, which can simplify the circuit structure.

The embodiments of the present application will be further explained below with reference to the drawings.

Figure 1:
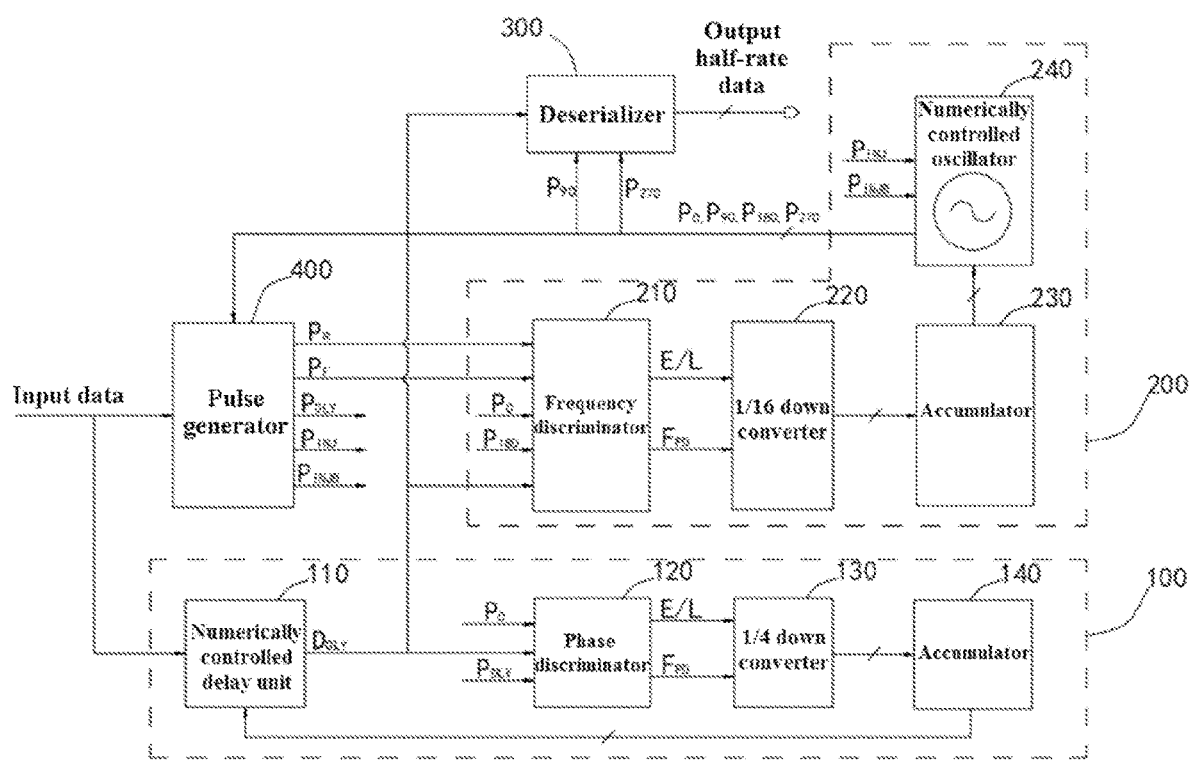
FIG. 1 is a block diagram of a clock data recovery circuit according to an embodiment of the present application.

In FIG. 1, a block diagram of a clock data recovery circuit according to an embodiment of the present application is shown.

As shown in FIG. 1, a first aspect embodiment of the present application provides a clock data recovery circuit, including a time delay loop 100, a frequency locking loop 200 and a deserializer 300. The time delay loop 100 is configured to delay input data according to a phase of a clock signal to realize phase alignment. The frequency locking loop 200 is connected to the time delay loop 100, and is configured to adjust a frequency of the clock signal according to the delayed input data to make the frequency of the clock signal be consistent with a frequency of the input data. The deserializer 300 is respectively connected to the time delay loop 100 and the frequency locking loop 200, and is configured to deserialize the input data according to the clock signal.

According to the clock data recovery circuit of this embodiment, phases of the clock signal and the input data are firstly compared to delay the input data, so as to realize phase alignment of the input data and the clock signal, thus introduction of a phase integral factor (factor of phase integral) is avoid. When the phases are aligned, the phase of the clock signal is consistent with the phase of the delayed input data. If the frequency of the delayed input data is not matched with the frequency of the clock signal, a certain phase difference will be generated after a period of time. The frequency locking loop 200 adjusts the frequency of the clock signal based on the phase difference generated due to the mismatch between the frequency of the delayed input data and the frequency of the clock signal, thereby achieving the object of frequency locking. When the frequencies and phases of both the input data and the clock signal are locked, the clock signal goes through the deserializer 300 to deserialize the input data. With the solution provided in this embodiment, introduction of a phase integral factor can be avoided throughout the circuit system, an absolute stable system with merely a single pole can be obtained, and the circuit structure can be simplified.

Referring to FIG. 1, in an embodiment, the time delay loop 100 includes a numerically controlled delay unit 110, a phase discriminator 120, a first downconverter 130 and a first accumulator 140 connected in sequence. An output of the first accumulator 140 is connected to the numerically controlled delay unit 110. The phase discriminator 120 is configured to perform a phase comparison between the clock signal and the input data. The numerically controlled delay unit 110 is configured to delay the input data according to a result of the phase comparison, and an output of the numerically controlled delay unit 110 is further connected to the deserializer 300 to output the delayed input data.

In this embodiment, the input data is transmitted from an input of the numerically controlled delay unit 110 to the time delay loop 100, which performs a phase comparison between the clock signal and the delayed input signal through the phase discriminator 120, so that the time delay in the numerically controlled delay unit 110 offsets an injection locking control logic delay.

Referring to FIG. 1, in an embodiment, the frequency locking loop 200 includes a frequency discriminator 210, a second downconverter 220, a second accumulator 230 and a numerically controlled oscillator 240 connected in sequence. The numerically controlled oscillator 240 outputs a clock signal to the phase discriminator 120, the frequency discriminator 210 and the deserializer 300, respectively. The output of the numerically controlled delay unit 110 is further connected to the frequency discriminator 210 to output the delayed input data.

In this embodiment, the frequency locking loop 200 starts to operate normally when the time delay loop 100 is locked. When the phases are locked, the phase of the clock signal after injection locking is consistent with the phase of the delayed input data. After a period of time, a certain phase difference will be generated due to the mismatch between the frequency of the clock signal and the frequency of the input data, which mismatch can be determined by the frequency discriminator 210, and be input into the second accumulator 230 through the second downconverter 220, thereby controlling an output frequency of the numerically controlled oscillator 240, and achieving the object of frequency locking. When the phases and the frequencies are both locked, the clock signal goes through the deserializer to deserialize the data and output half-rate data.

Referring to FIG. 1, in an embodiment, the clock data recovery circuit further includes a pulse generator 400 having an output connected to the numerically controlled oscillator 240 to output a phase nulling pulse. The numerically controlled oscillator 240 performs phase nulling on the output clock signal according to the received phase nulling pulse.

In this embodiment, phase locking is achieved through phase nulling (or called phase zero-setting), wherein certain control logic is used to generate a pulse signal to perform phase nulling on the clock signal output from the numerically controlled oscillator 240. In this manner, introduction of a phase integral factor into the numerically controlled oscillator 240 can be avoided, therefore an absolute stable system with merely a single pole can be obtained, and thus, an absolute stable system is provided for simplifying the circuit structure.

Referring to FIG. 1, in an embodiment, the pulse generator 400 is provided with an input configured to receive input data, so as to generate the phase nulling pulse according to a rising edge of the input data.

In this embodiment, after receiving the input data, the pulse generator 400 generates the phase nulling pulse according to a rising edge of the input data, so as to perform phase nulling on the clock signal output from the numerically controlled oscillator 240. It will be appreciated that the pulse generator 400 generates phase nulling pulses at intervals, for example, every tens of cycles.

Referring to FIG. 1, in an embodiment, the pulse generator 400 is connected to the phase discriminator 120 to trigger the phase discriminator 120 to perform a phase comparison between the clock signal and the input data.

In this embodiment, in addition to being connected to the numerically controlled oscillator 240, the pulse generator 400 is further connected to the phase discriminator 120. After outputting a phase nulling pulse to the numerically controlled oscillator 240, the pulse generator 400 further outputs a trigger signal to the phase discriminator 120 to trigger the phase discriminator 120 to perform phase comparison between the clock signal and the input data. After passing through the first downconverter 130 and the first accumulator 140, the input data is delayed by the numerically controlled delay unit 110 based on the phase difference between the clock signal and the input data, so as to realize phase alignment of the input data and the clock signal.

Referring to FIG. 1, in an embodiment, the pulse generator 400 is connected to the frequency discriminator 210 to trigger the frequency discriminator 210 to determine frequencies of the clock signal and the delayed input data.

In this embodiment, the frequency locking loop 200 starts to operate when the time delay loop 100 is locked. Therefore, the pulse generator 400 is connected to the frequency discriminator 210 to output a trigger signal to the frequency discriminator 210, so that the discriminator 210 determines frequencies of the clock signal and the delayed input data after the phase locking. It will be appreciated that the frequency discriminator 210 may also determine the frequencies of the clock signal and the input data before the phase locking, i.e., determine frequencies of the clock signal and the input data not delayed. However, the result of the frequency determination is not accurate due to lack of injection locking of the clock signal.

In the above clock data recovery circuit, phase alignment is achieved by phase nulling, wherein a certain control logic is used to generate a pulse signal to perform phase nulling on the clock output from the numerically controlled oscillator. Within a certain time after the phase nulling, a frequency determination is performed, so as to reduce one phase integral factor. Therefore, an absolute stable system with merely a single pole can be obtained, and thus, an absolute stable system is provided for simplifying the circuit structure.

Based on the clock data recovery circuit of the above embodiments, various embodiments of a clock data recovery method are presented below.

Figure 6:
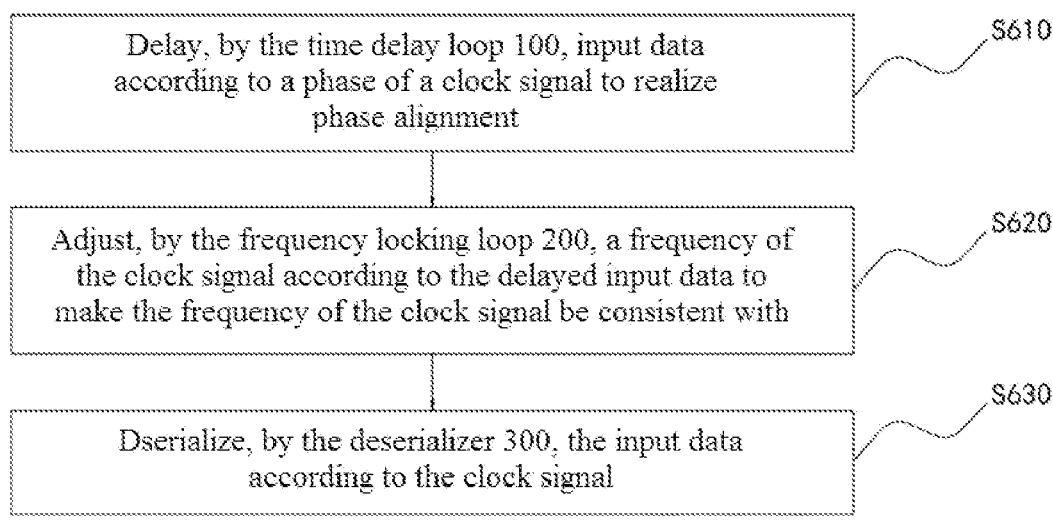
FIG. 6 is a flowchart of a clock data recovery method according to an embodiment of the present application.

Referring to FIG. 6, an embodiment of the present application further provides a clock data recovery method applied to the clock data recovery circuit as shown in FIG. 1. The clock data recovery circuit includes a time delay loop 100, a frequency locking loop 200 and a deserializer 300. The time delay loop 100 is connected to the frequency locking loop 200. The deserializer 300 is respectively connected to the time delay loop 100 and the frequency locking loop 200. The clock data recovery method includes the following operations S610 to S630.

At operation S610: delaying, by the time delay loop 100, input data according to a phase of a clock signal to realize phase alignment.

At operation S620: adjusting, by the frequency locking loop 200, a frequency of the clock signal according to the delayed input data to make the frequency of the clock signal be consistent with a frequency of the input data.

At operation S630: deserializing, by the deserializer 300, the input data according to the clock signal.

According to the clock data recovery method provided in the embodiment, phases of the clock signal and the input data are firstly compared to by the time delay loop 100, so that the input data is delayed to realize phase alignment of the input data and the clock signal, thus introduction of a phase integral factor is avoided. When the phases are aligned, the phase of the clock signal is consistent with the phase of the delayed input data. If the frequency of the delayed input data is not matched with the frequency of the clock signal, a certain phase difference will be generated after a period of time. The frequency locking loop 200 adjusts the frequency of the clock signal based on the phase difference generated due to the mismatch between the frequency of the delayed input data and the frequency of the clock signal, thereby achieving the object of frequency locking. When the frequencies and phases of both the input data and the clock signal are locked, the clock signal goes through the deserializer 300 to deserialize the input data. With the solution provided in this embodiment, introduction of a phase integral factor can be avoided throughout the circuit system, an absolute stable system with merely a single pole can be obtained, and the circuit structure can be simplified.

Referring to FIG. 1, in an embodiment, the time delay loop 100 includes a numerically controlled delay unit 110, a phase discriminator 120, a first downconverter 130 and a first accumulator 140 connected in sequence. An output of the first accumulator 140 is connected to the numerically controlled delay unit 110, and an output of the numerically controlled delay unit 110 is connected to the deserializer 300.

Figure 7:
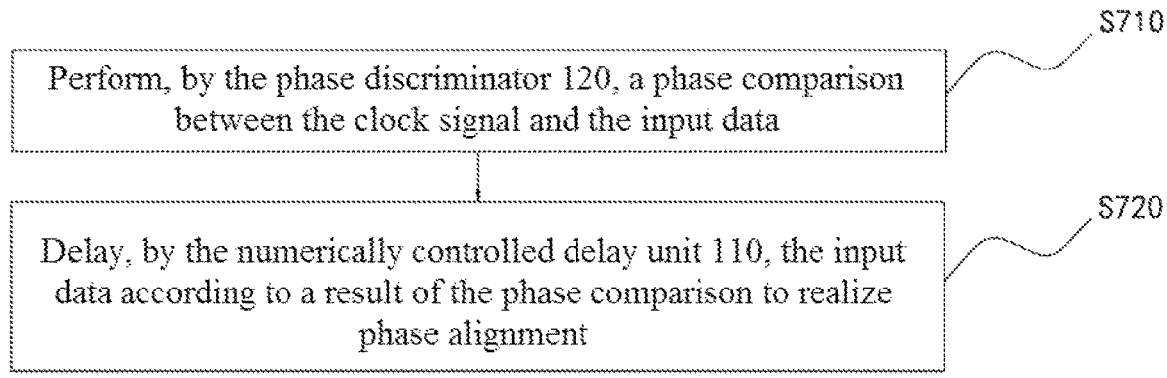
FIG. 7 is a flowchart of a clock data recovery method according to another embodiment of the present application.

Referring to FIG. 7, the operation S610 of delaying, by the time delay loop 100, input data according to the phase of the clock signal to realize phase alignment includes the following operations S710 to S720.

At operation S710: performing, by the phase discriminator 120, a phase comparison between the clock signal and the input data.

At operation S720: delaying, by the numerically controlled delay unit 110, the input data according to a result of the phase comparison to realize phase alignment.

In this embodiment, the input data is transmitted from an input of the numerically controlled delay unit 110 to the time delay loop 100, which performs a phase comparison between the clock signal and the delayed input signal through the phase discriminator 120. The numerically controlled delay unit 110 delays the input data according to a result of the phase comparison to realize phase alignment, so that the time delay in the numerically controlled delay unit 110 offsets an injection locking control logic delay.

Referring to FIG. 1, in an embodiment, the frequency locking loop 200 includes a frequency discriminator 210, a second downconverter 220, a second accumulator 230 and a numerically controlled oscillator 240 connected in sequence. The numerically controlled oscillator 240 is connected to the phase discriminator 120, the frequency discriminator 210 and the deserializer 300, respectively. The output of the numerically controlled delay unit 110 is further connected to the frequency discriminator 210.

Figure 8:
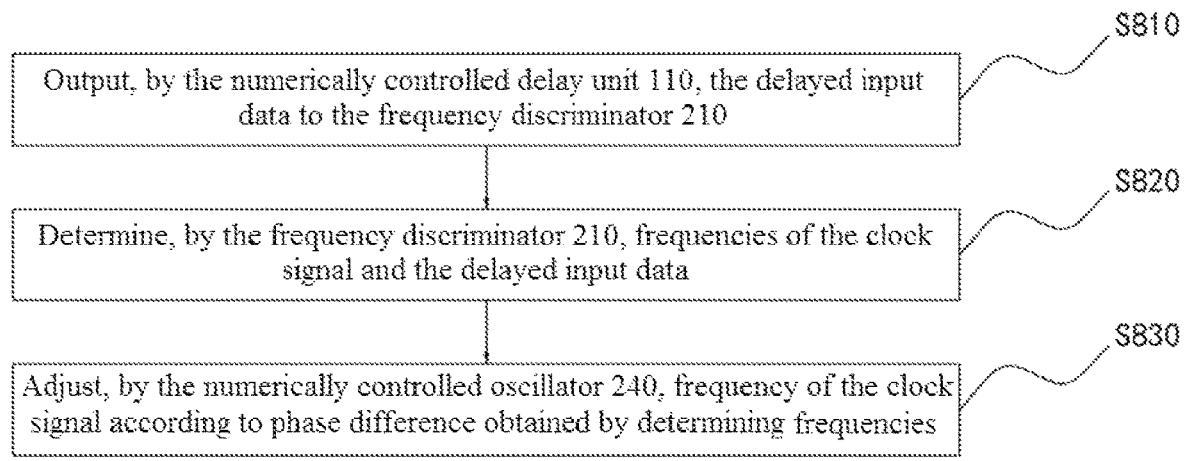
FIG. 8 is a flowchart of a clock data recovery method according to yet another embodiment of the present application.

Referring to FIG. 8, the operation S620 of adjusting, by the frequency locking loop 200, the frequency of the clock signal according to the delayed input data to make the frequency of the clock signal be consistent with the frequency of the input data includes the following operations S810 to S830.

At operation S810: outputting, by the numerically controlled delay unit 110, the delayed input data to the frequency discriminator 210.

At operation S820, determining, by the frequency discriminator 210, frequencies of the clock signal and the delayed input data.

At operation S830: adjusting, by the numerically controlled oscillator 240, the frequency of the clock signal according to a phase difference obtained by determining the frequencies.

In this embodiment, the frequency locking loop 200 starts to operate normally when the time delay loop 100 is locked, and thus, the numerically controlled delay unit 110 outputs the delayed input data to the frequency discriminator 210.

When the phases are locked, the phase of the clock signal after injection locking is consistent with the phase of the delayed input data. After a period of time, a certain phase difference will be generated due to the mismatch between the frequency of the clock signal and the frequency of the input data, which mismatch can be determined by the frequency discriminator 210, and be input into the second accumulator 230 through the second downconverter 220, thereby controlling an output frequency of the numerically controlled oscillator 240, and achieving the object of frequency locking. When the phases and the frequencies are both locked, the clock signal goes through the deserializer to deserialize the data and output half-rate data.

Implementations of the present application are further described below with reference to FIGS. 1 to 5.

Figure 2:
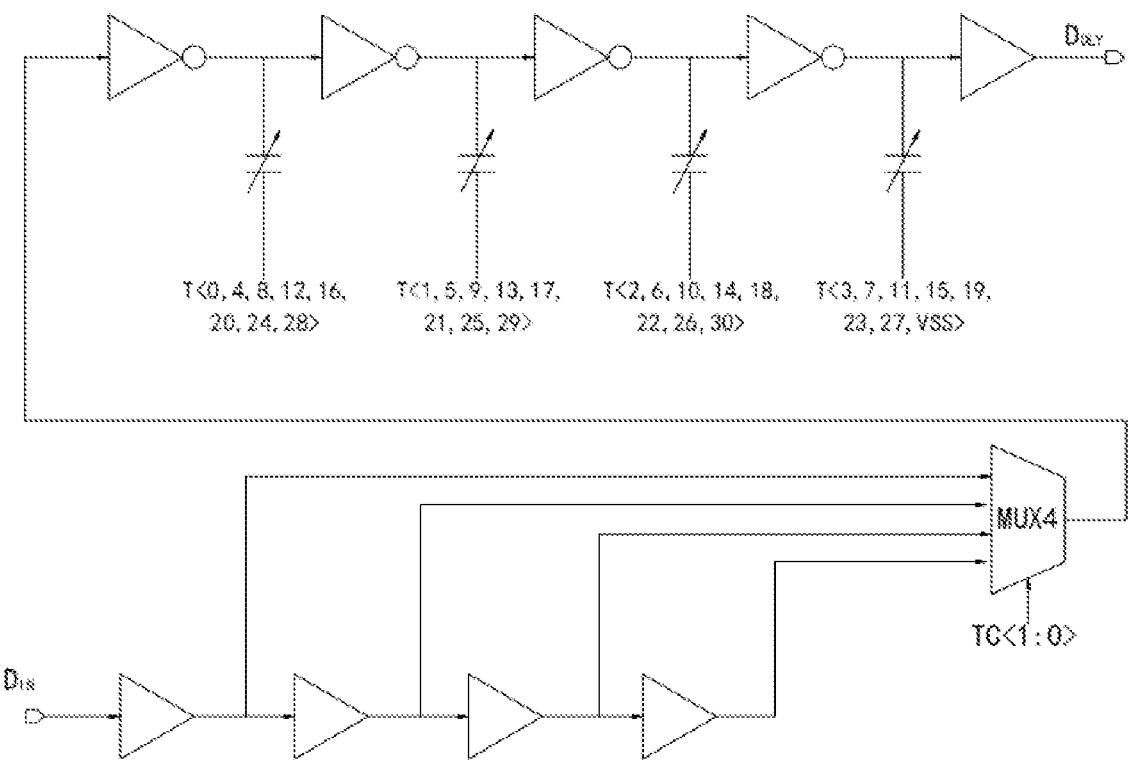
FIG. 2 is a circuit diagram of a numerically controlled delay unit of a clock data recovery circuit according to an embodiment of the present application.
Figure 3:
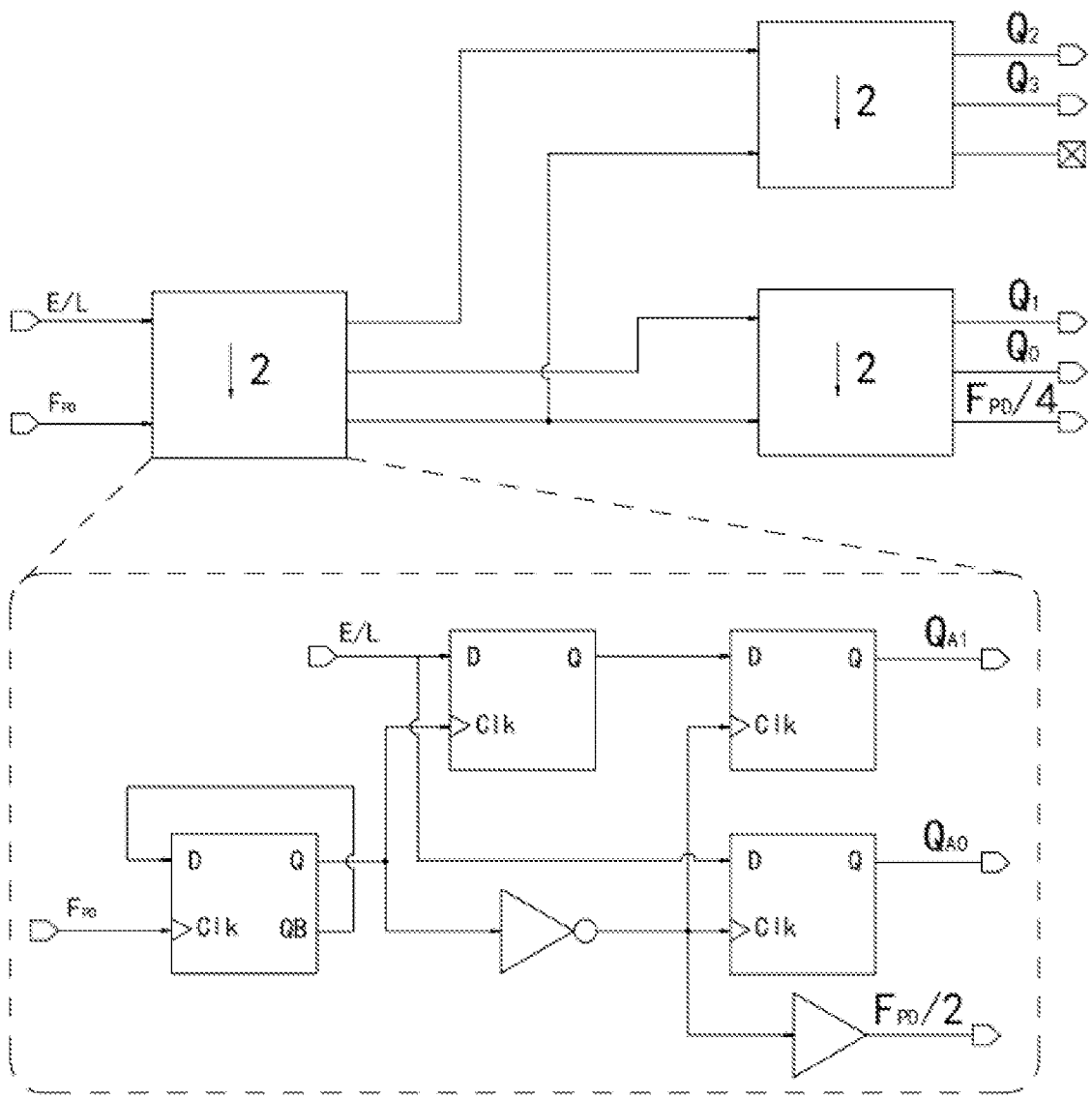
FIG. 3 is a circuit diagram of an ¼ downconverter according to an embodiment of the present application.
Figure 4:
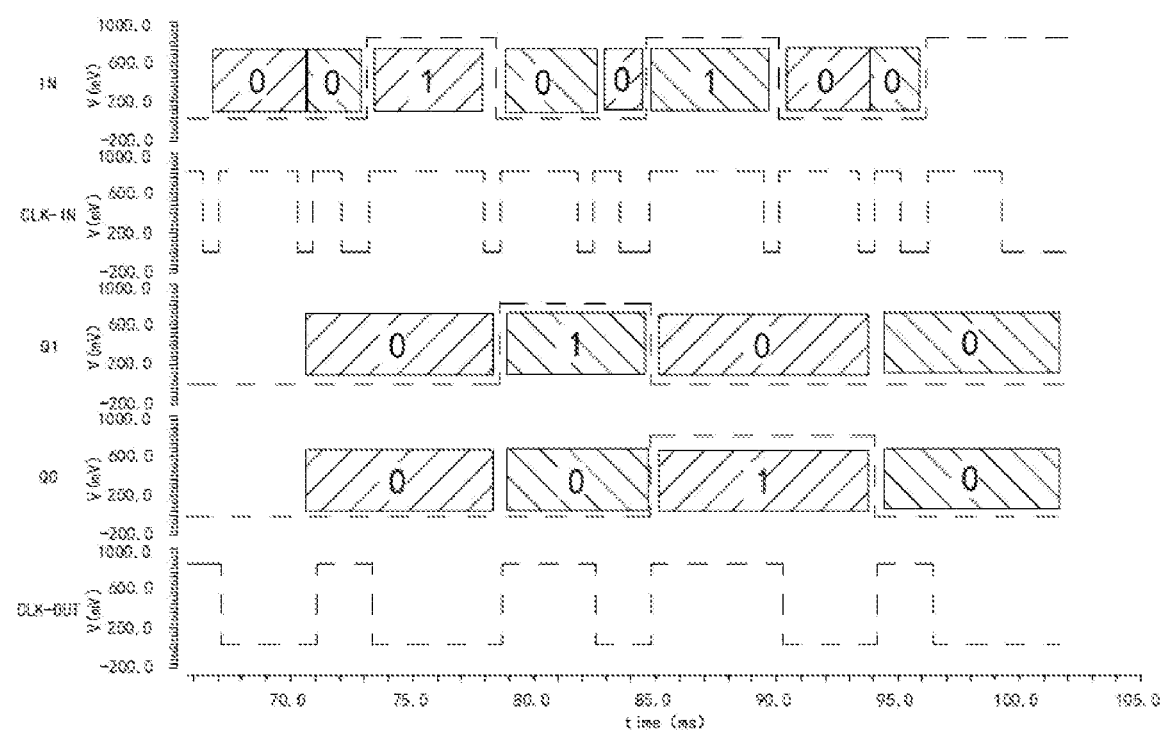
FIG. 4 is a timing diagram illustrating operation of a ¼ downconverter circuit according to an embodiment of the present application.
Figure 5:
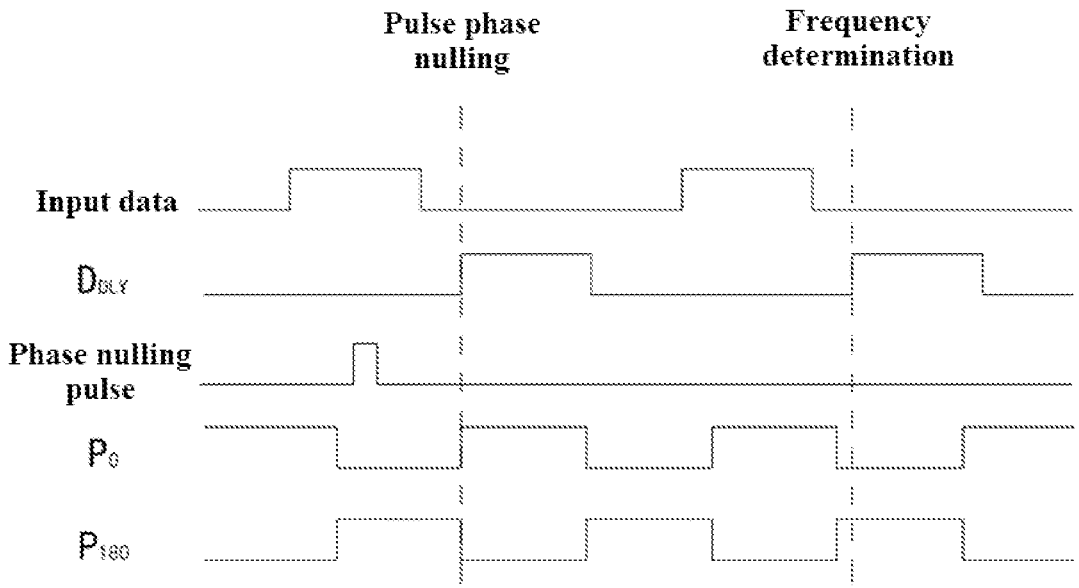
FIG. 5 is a timing diagram of phase nulling and frequency determination according to an embodiment of the present application.

A clock data recovery circuit provided in a specific embodiment of the present application is shown in FIG. 1. The clock data recovery circuit includes one time delay loop 100, one frequency locking loop 200, one deserializer 300 and a pulse generator 400. The time delay loop 100 includes a numerically controlled delay unit 110, a phase discriminator 120, a first downconverter 130 and a first accumulator 140 connected in sequence. An output of the first accumulator 140 is connected to the numerically controlled delay unit 110. The frequency locking loop 200 includes a frequency discriminator 210, a second downconverter 220, a second accumulator 230 and a numerically controlled oscillator 240 connected in sequence. The numerically controlled oscillator 240 outputs a clock signal to the phase discriminator 120, the frequency discriminator 210 and the deserializer 300, respectively. An output of the numerically controlled delay unit 110 is further connected to the frequency discriminator 210 and the deserializer 300. An output of the pulse generator 400 is connected to the numerically controlled oscillator 240 to output a phase nulling pulse. When the system is locked, data passing through the numerically controlled delay unit 110 is deserialized and output. The time delay loop 100 performs a phase comparison between a clock signal $P_0$ and the delayed input data $D_{DLY}$ through the phase discriminator 120, so that the time delay in the numerically controlled delay unit 110 offsets an injection locking control logic delay. The frequency locking loop 200 starts to operate normally when the time delay loop 100 locks the phases. When the phases are locked, the phase of the clock signal $P_0$ after injection locking is consistent with the phase of the input data $D_{DLY}$. After a period of time, a certain phase difference will be generated due to the mismatch between the frequency of the clock signal $P_0$ and the frequency of the input data $D_{DLY}$, which mismatch can be determined by the frequency discriminator 210, and be input into the digital accumulator (second accumulator) 230 through the 1/16 downconverter (second downconverter) 220, thereby controlling an output frequency of the numerically controlled oscillator 240, and achieving the object of frequency locking. When the frequencies and the phases are both locked, the clock goes through the deserializer 300 to deserialize the data and output half-rate data. Phase locking is achieved through phase nulling, and a certain control logic is used to generate a pulse signal to perform phase nulling on the clock signal output from the numerically controlled oscillator 240. In this manner, introduction of a phase integral factor into the numerically controlled oscillator can be avoided, an absolute stable system with merely a single pole can be obtained, and thus, an absolute stable system is provided for simplifying the circuit structure. FIG. 2 is a schematic circuit diagram of the numerically controlled delay unit 110. The numerically controlled delay unit 110 performs coarse tuning by selecting different signals with a 2-bit binary code, and performs fine tuning with a 31-bit thermometer code. Control bits of the thermometer code are uniformly distributed under four loads so that a difference in magnitude of load capacitors is minimized when the thermometer code is changed, thereby avoiding an influence on the duty cycle of signals. FIG. 3 is a schematic circuit diagram of the 1/4 downconverter 130. Since the clock data recovery circuit typically has a relatively high frequency, data obtained by the frequency discriminator or the phase discriminator also has a relatively higher frequency, making it impossible to directly enter the accumulator for processing. Therefore, the data is firstly processed by the downconverter before entering the accumulator. The working principle of the downconverter is: splitting a single data piece and clock information into two data pieces, while reducing the clock frequency to a half. FIG. 4 is a timing diagram illustrating operation of the 1/4 downconverter circuit. FIG. 5 is a timing diagram of phase nulling and frequency determination according to an embodiment of the present application. When a phase nulling pulse is generated, the delayed input data $D_{DLY}$ is consistent with the clock signal $P_0$ in phase, and rising edges of the two are aligned. When the phases are consistent, a phase difference will be generated after a period of time due to inconsistent frequencies of the data and the clock, and frequency determination may be performed based on information of the phase difference. The frequency determination result shown in FIG. 5 indicates that the frequency of the clock signal is too high. Therefore, the output determination result will be used to reduce an output frequency of the numerically controlled oscillator 240.

The embodiments of the present application include: a clock data recovery circuit and a clock data recovery method. The clock data recovery circuit includes a time delay loop, a frequency locking loop and a deserializer. The time delay loop is configured to delay input data according to a phase of a clock signal to realize phase alignment. The frequency locking loop is connected to the time delay loop, and is configured to adjust a frequency of the clock signal according to the delayed input data to make the frequency of the clock signal be consistent with a frequency of the input data. The deserializer is respectively connected to the time delay loop and the frequency locking loop, and is configured to deserialize the input data according to the clock signal. According to the solution provided in the embodiments of the present application, phases of the clock signal and the input data are firstly compared to delay the input data, so as to realize phase alignment of the input data and the clock signal, thus introduction of a phase integral factor is avoided. When the phases are aligned, the phase of the clock signal is consistent with the phase of the delayed input data. If the frequency of the delayed input data is not matched with the frequency of the clock signal, a certain phase difference will be generated after a period of time. The frequency locking loop can adjust the frequency of the clock signal based on the phase difference generated due to the mismatch between the frequency of the delayed input data and the frequency of the clock signal, thereby achieving the object of frequency locking. When the frequencies and phases of both the input data and the clock signal are locked, the clock signal goes through the deserializer to deserialize the input data. With the solution provided in this embodiment, introduction of a phase integral factor can be avoided throughout the circuit system, an absolute stable system with merely a single pole can be obtained, and the circuit structure can be simplified.

The embodiments of the present application have been described in detail with reference to the drawings, but the present application is not limited to the above embodiments, and various changes can be made within the knowledge of those skilled in the art without departing from the scope of the present application.

What is claimed is:

1. A clock data recovery circuit, comprising:
    a time delay loop configured to delay input data according to a phase of a clock signal to realize phase alignment;
    a frequency locking loop connected to the time delay loop and configured to adjust a frequency of the clock signal according to the delayed input data to make the frequency of the clock signal be consistent with a frequency of the input data; and
    a deserializer respectively connected to the time delay loop and the frequency locking loop and configured to deserialize the input data according to the clock signal.

2. The clock data recovery circuit according to claim 1, wherein the time delay loop comprises a numerically controlled delay unit, a phase discriminator, a first downconverter and a first accumulator connected in sequence, wherein an output of the first accumulator is connected to the numerically controlled delay unit, the phase discriminator is configured to perform a phase comparison between the clock signal and the input data, the numerically controlled delay unit is configured to delay the input data according to a result of the phase comparison, and an output of the numerically controlled delay unit is further connected to the deserializer to output the delayed input data.

3. The clock data recovery circuit according to claim 2, wherein the frequency locking loop comprises a frequency discriminator, a second downconverter, a second accumulator and a numerically controlled oscillator connected in sequence, wherein the numerically controlled oscillator outputs a clock signal to the phase discriminator, the frequency discriminator and the deserializer, respectively, and wherein the output of the numerically controlled delay unit is further connected to the frequency discriminator to output the delayed input data.

4. The clock data recovery circuit according to claim 3, further comprising a pulse generator having an output connected to the numerically controlled oscillator to output a phase nulling pulse, wherein the numerically controlled oscillator performs phase nulling on the output clock signal according to the received phase nulling pulse.

5. The clock data recovery circuit according to claim 4, wherein the pulse generator is provided with an input configured to receive input data, so as to generate the phase nulling pulse according to a rising edge of the input data.

6. The clock data recovery circuit according to claim 4, wherein the pulse generator is connected to the phase discriminator to trigger the phase discriminator to perform a phase comparison between the clock signal and the input data.

7. The clock data recovery circuit according to claim 4, wherein the pulse generator is connected to the frequency discriminator to trigger the frequency discriminator to determine frequencies of the clock signal and the delayed input data.

8. A clock data recovery method applied to a clock data recovery circuit, the clock data recovery circuit comprising a time delay loop, a frequency locking loop and a deserializer, wherein the time delay loop is connected to the frequency locking loop, and the deserializer is respectively connected to the time delay loop and the frequency locking loop, and wherein the method comprises:
    delaying, by the time delay loop, input data according to a phase of a clock signal to realize phase alignment;
    adjusting, by the frequency locking loop, a frequency of the clock signal according to the delayed input data to make the frequency of the clock signal be consistent with a frequency of the input data; and
    deserializing, by the deserializer, the input data according to the clock signal.

9. The clock data recovery method according to claim 8, wherein the time delay loop comprises a numerically controlled delay unit, a phase discriminator, a first downconverter and a first accumulator connected in sequence, wherein an output of the first accumulator is connected to the numerically controlled delay unit, and an output of the numerically controlled delay unit is connected to the deserializer; and
    wherein the delaying, by the time delay loop, input data according to the phase of the clock signal to realize phase alignment comprises:
        performing, by the phase discriminator, a phase comparison between the clock signal and the input data; and
        delaying, by the numerically controlled delay unit, the input data according to a result of the phase comparison to realize phase alignment.

10. The clock data recovery method according to claim 9, wherein the frequency locking loop comprises a frequency discriminator, a second downconverter, a second accumulator and a numerically controlled oscillator connected in sequence, wherein the numerically controlled oscillator is connected to the phase discriminator, the frequency discriminator and the deserializer, respectively, and wherein the output of the numerically controlled delay unit is further connected to the frequency discriminator; and
    wherein the adjusting, by the frequency locking loop, the frequency of the clock signal according to the delayed input data to make the frequency of the clock signal be consistent with the frequency of the input data comprises:
        outputting, by the numerically controlled delay unit, the delayed input data to the frequency discriminator;
        determining, by the frequency discriminator, frequencies of the clock signal and the delayed input data; and
        adjusting, by the numerically controlled oscillator, the frequency of the clock signal according to a phase difference obtained by determining the frequencies.

* * * * *